US007780265B2

(12) United States Patent
Taira et al.

(10) Patent No.: US 7,780,265 B2
(45) Date of Patent: Aug. 24, 2010

(54) INK-JET HEAD AND METHOD OF MANUFACTURING THE SAME

(75) Inventors: Hiroshi Taira, Ichinomiya (JP); Tadanobu Chikamoto, Nagoya (JP); Yoshirou Kita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 625 days.

(21) Appl. No.: 11/689,499

(22) Filed: Mar. 21, 2007

(65) Prior Publication Data

US 2007/0229606 A1 Oct. 4, 2007

(30) Foreign Application Priority Data

Mar. 31, 2006 (JP) ............................ 2006-097262

(51) Int. Cl.
*B41J 2/14* (2006.01)
*B41J 2/045* (2006.01)
*H01L 41/22* (2006.01)

(52) U.S. Cl. .......................... 347/50; 347/71; 29/25.35

(58) Field of Classification Search .................. 347/50, 347/58, 68–72; 29/25.35
See application file for complete search history.

(56) References Cited

U.S. PATENT DOCUMENTS 6,802,596 B2 * 10/2004 Higuchi et al. ................ 347/68
2005/0041074 A1 2/2005 Watanabe et al.
2006/0017779 A1 * 1/2006 Ito ............................ 347/50

FOREIGN PATENT DOCUMENTS

JP 2005-022148 A 1/2005

* cited by examiner

*Primary Examiner*—Stephen D Meier
*Assistant Examiner*—Geoffrey Mruk
(74) *Attorney, Agent, or Firm*—Baker Botts L.L.P.

(57) ABSTRACT

An ink-jet head includes a flexible print cable (FPC) supplying a driving signal to an actuator unit. The actuator unit has a piezoelectric member, an inner electrode, individual electrodes formed on a surface of the piezoelectric member, a first surface terminal and second surface terminals. A partial area of the FPC confronts the surface of the piezoelectric member and an adjacent area continuous to the partial area extends in a direction away from the surface of the piezoelectric member. A distance between an end of the surface of the piezoelectric member closest to the adjacent area and the first surface terminal is equal to or greater than a distance between the end surface of the piezoelectric member and the second surface terminal disposed closest thereto. The FPC is adhered proximate the end of the piezoelectric member via a thermosetting adhesive.

18 Claims, 10 Drawing Sheets

INK-JET HEAD AND METHOD OF MANUFACTURING THE SAME

CROSS-REFERENCE TO RELATED APPLICATION

This application claims priority to and the benefit of Japanese Patent Application No. 2006-097262, which was filed on Mar. 31, 2006, the disclosure of which is incorporated herein by reference.

BACKGROUND OF THE INVENTION

1. Field of the Invention

The present invention relates to an ink-jet head that ejects ink on a recording medium for recording and a method of manufacturing the same.

2. Description of Related Art

An ink-jet head disclosed in a Japanese Patent Unexamined Publication No. 2005-22148 includes a unit having a number of nozzles and pressure chambers communicating with the respective nozzles. To a surface of the unit in which the pressure chambers are formed are fixed four piezoelectric sheets. Flexible printed circuit boards (FPC) are respectively fixed to each of the piezoelectric sheets. The FPC is one type of a flexible print cable. The piezoelectric sheets function as actuators. The piezoelectric sheets are formed on surfaces thereof with individual electrodes corresponding to the respective pressure chambers. The respective individual electrodes are electrically connected to the FPC via conductive lands adhered thereto. When a driving signal is supplied to the individual electrodes through the FPC, the volumes of the pressure chambers corresponding to the individual electrodes are changed and pressure is applied to ink in the corresponding pressure chambers. Thereby, the ink is ejected to a recording medium such as paper from the nozzles, so that an image is recorded on the recording medium.

The surfaces of the piezoelectric sheets are formed with common electrodes in addition to the individual electrodes. The common electrodes are formed at four corners of the piezoelectric sheet having a trapezoidal shape. Each of the common electrodes is electrically connected to an inner electrode formed in the piezoelectric sheet. The common electrodes are also adhered to the conductive lands, likewise the individual electrodes. The common electrodes are electrically connected to the FPC via the lands.

The vicinity of a leading end of the FPC is fixed to the upper surface of the piezoelectric sheet and a leading end side of the FPC is approximately identical to an upper base, i.e., short side of the piezoelectric sheet having a trapezoidal shape. The FPC is drawn-out into an outside, beyond the lower base, i.e., long side of the piezoelectric sheet. A part of the FPC, which is closer to the base thereof than the lower base of the piezoelectric sheet, is not fixed to the piezoelectric sheet. The lands adhered to the two common electrodes close to the lower base are disposed at positions closer to the lower base than the lands adhered to any individual electrodes.

When fixing the FPC to the piezoelectric sheet, soldering is applied to terminals formed on the FPC and heat is applied to the terminals and the lands while aligning the respective terminals and the lands, thereby adhering the terminals and the lands.

SUMMARY OF THE PRESENT INVENTION

In the ink-jet head as described above, the part of the FPC, which is not fixed to the piezoelectric sheet, i.e., the part to which a driving circuit and/or heat sink is attached is sometimes bent upward. In this case, since the FPC is pulled upward, force that will destroy the electrical connection between the FPC and the piezoelectric sheet, i.e., force that will separate the terminals from the lands is applied. Herein, as described above, when the lands adhered to the two common electrodes close to the lower base are disposed at positions closer to the lower base than the lands adhered to any individual electrodes, if the terminals of the FPC are separated from the lands adhered to the common electrodes, the terminals, which are adhered to the lands adhered to the individual electrodes, are also separated from the lands from the terminals closer to the lower base, one after another. As a result, the electrical connection between the FPC and the piezoelectric sheet is disconnected.

An object of the present invention is to provide an ink-jet head capable of preventing electric connection between a flexible print cable and an actuator from being destroyed and a method of manufacturing the same.

There is provided an ink-jet head comprising a passage unit, an actuator unit and a flexible print cable. The passage unit has a number of pressure chambers communicating with nozzles. The actuator unit changes the volumes of the pressure chambers. The flexible print cable supplies a driving signal to the actuator unit. The actuator unit includes a piezoelectric member fixed to the passage unit so that it extends across the pressure chambers, an inner electrode formed so that it extends across the pressure chambers in the piezoelectric member, a number of individual electrodes formed at positions corresponding to the pressure chambers on a surface facing a direction opposite to a facing direction of a fixing face of the piezoelectric member to the passage unit, a first surface terminal that is formed on the surface of the piezoelectric member and is also electrically connected to the inner electrode, and a plurality of second surface terminals that are formed on the surface of the piezoelectric member and are also electrically connected to the individual electrodes. A partial area of the flexible print cable confronts the surface of the piezoelectric member and an adjacent area continuous to the partial area extends in a direction away from the surface of the piezoelectric member. The flexible print cable has, in the partial area, a first connection terminal electrically connected to the first surface terminal and a number of second connection terminals electrically connected to the second surface terminals. A distance between an end present at the most downstream position on the surface of the piezoelectric member with respect to a first direction toward the adjacent area on the partial area and the first surface terminal is equal to or greater than a distance between the second surface terminals disposed closest to the end and the end. The flexible print cable is adhered to the piezoelectric member at a more downstream position than the first and second surface terminals with respect to the first direction, via a thermosetting adhesive.

According to the above structure, the first surface terminal, which is formed on the surface of the piezoelectric member and is also electrically connected to the inner electrode, is not disposed at a more downstream position than the second surface terminals with respect to the first direction which is a draw-out direction of the flexible print cable, but is disposed at a same or more upstream position as the second surface terminals with respect to the first direction. Therefore, a distance between an end present at the most downstream position with respect to the first direction on the surface of the piezoelectric member, and the second surface terminal closest to the end becomes large. None of the first and second surface terminals are disposed in the area on the surface, which is present between the corresponding end and the second surface terminal closest to the end. Accordingly, it is easy for the flexible print cable to bend toward the area, thereby contacting the piezoelectric member. In a contact part, the flexible print cable is adhered to the piezoelectric member via the thermosetting adhesive. By the adhesion via the thermosetting adhesive, the adhesion reinforcement between the flexible print cable and the actuator unit is realized. Therefore, when the flexible print cable is bent so that the adjacent area of the flexible print cable extends in a direction away from the surface, the electrical connection between the flexible print cable and the actuator unit, i.e., the connections between the first and second connection terminals of the flexible print cable and the first and second surface terminals are not directly applied with force. As a result, it is possible to prevent the electrical connection from being destroyed.

In addition, a method of manufacturing an ink-jet head according to the present invention comprises processes of preparing a passage unit, preparing an actuator unit, fixing the actuator unit to the passage unit, and fixing a flexible print cable to the actuator unit. The passage unit has a number of pressure chambers communicating with nozzles. The actuator unit changes the volumes of the pressure chambers and includes a piezoelectric member having an inner electrode formed therein. The flexible print cable supplies a driving signal to the actuator unit and has a partial area in which a first connection terminal and a plurality of second connection terminals are formed and an adjacent area continuous to the partial area. The process of preparing the actuator unit comprises an electrode forming process of forming a number of individual electrodes on a surface of the piezoelectric member, and a terminal forming process of forming a first surface terminal electrically connected to the inner electrode and a number of second surface terminals adhered to the individual electrodes on the surface of the piezoelectric member. In the process of fixing the actuator unit, a fixing face of the piezoelectric member, which faces a direction opposite to a facing direction of the surface, is fixed to the passage unit so that the individual electrodes are disposed at positions corresponding to the pressure chambers while the piezoelectric member and the inner electrode extend across the pressure chambers. In the terminal forming process, the first surface terminal is formed so that a distance between an end present at the most downstream position on the surface of the piezoelectric member with respect to a first direction toward the adjacent area on the partial area along the surface and the first surface terminal is equal to or greater than a distance between the second surface terminal disposed closest to the end and the end. In the process of fixing the flexible print cable, the first connection terminal is electrically connected to the first surface terminal and the second connection terminals are electrically connected to the second surface terminals by heating so that the partial area confronts the surface of the piezoelectric member, and the flexible print cable is adhered to the piezoelectric member at a more downstream position than the first and second surface terminals with respect to the first direction, via a thermosetting adhesive. The method further comprises a process of bending the flexible print cable so that the adjacent area continuous to the partial area of the flexible print cable extends in a direction away from the surface of the piezoelectric member.

According to the above structure, it is possible to realize the electrical connections between the first and second connection terminals of the flexible print cable and the first and second surface terminals and the mechanical connection between the flexible print cable and the piezoelectric member via the thermosetting adhesive in a single process. Accordingly, it is possible to obtain the ink-jet head of the present invention achieving the above advantages while suppressing the increase in the number of the manufacturing processes.

BRIEF DESCRIPTION OF THE DRAWINGS

Other and further objects, features and advantages of the present invention will appear more fully from the following description taken in connection with the accompanying drawings in which.

DESCRIPTION OF THE PREFERRED EMBODIMENTS

Figure 1:
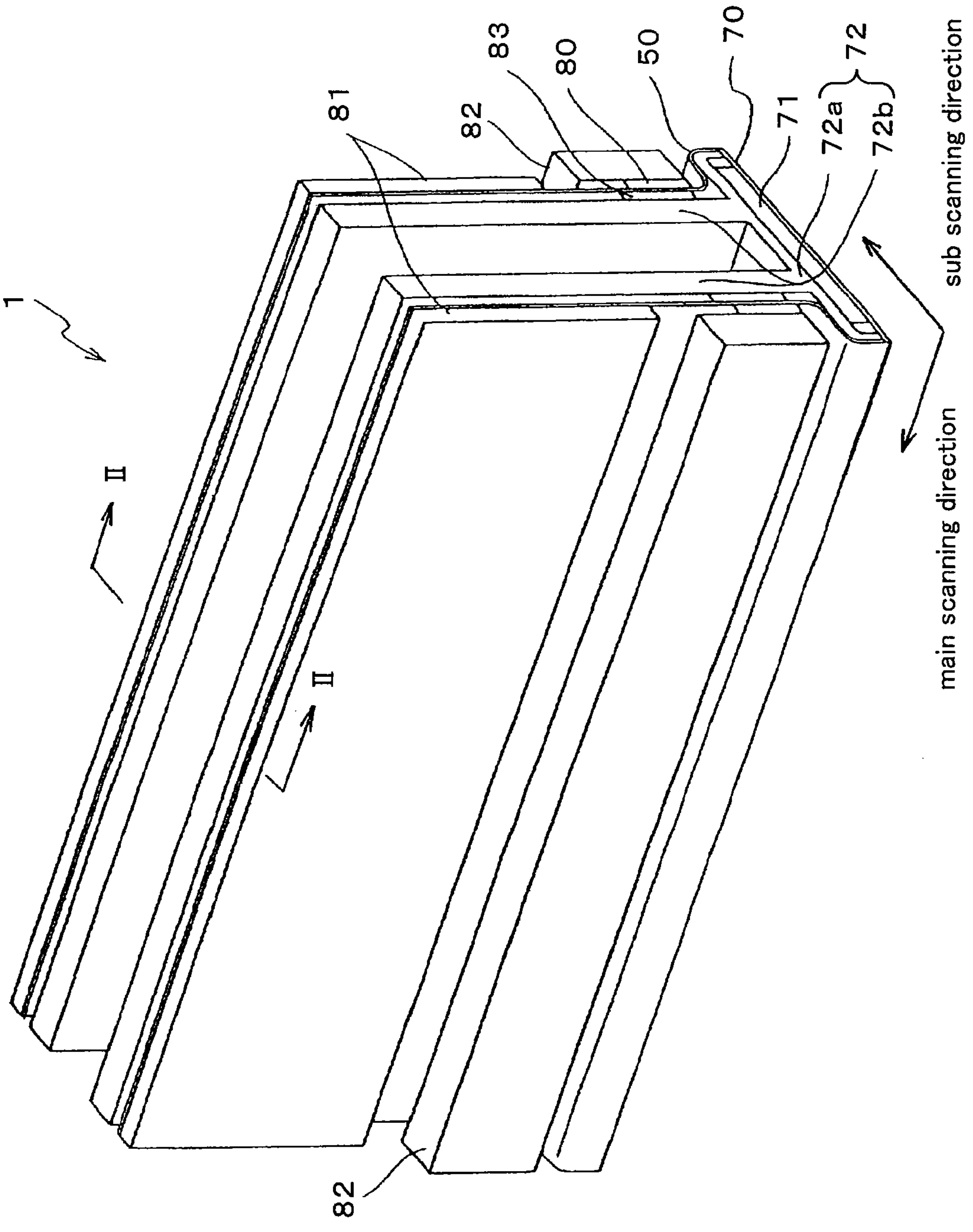
FIG. 1 is a perspective view of an ink-jet head according to an embodiment of the present invention.
Figure 2:
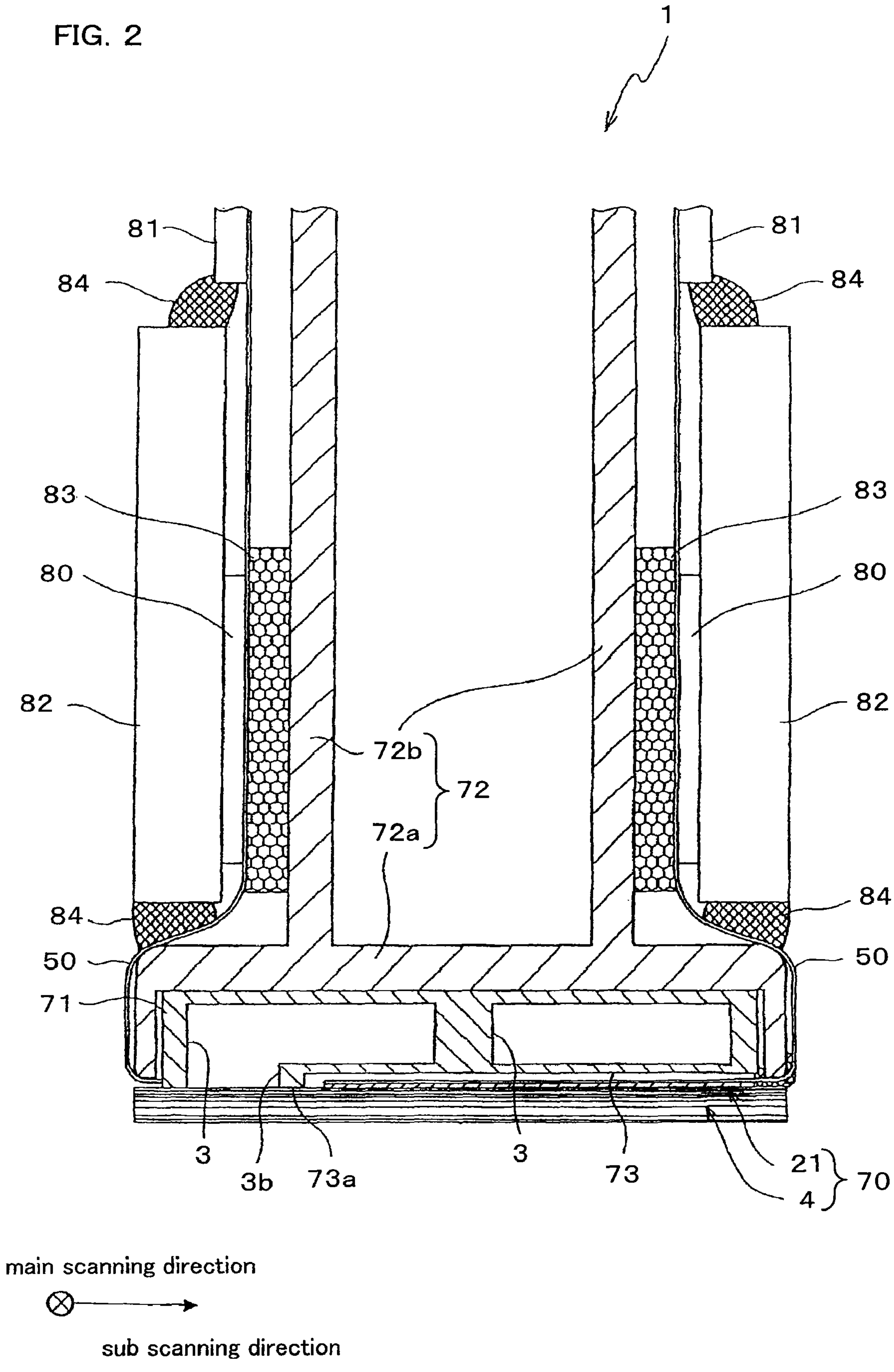
FIG. 2 is a sectional view taken along a line II-II shown in FIG. 1.

As shown in FIGS. 1 and 2, an ink-jet head 1 according to an embodiment of the present invention includes a head main body 70, a reservoir unit 71 that stores ink to be supplied to a passage unit 4 of the head main body 70, a holder 72 that holds the reservoir unit 71, and flexible printed circuit boards (FPC) 50 that supply driving signals, which are outputted from driver ICs 80 to actuator units 21 of the head main body 70.

As shown in FIG. 2, the head main body 70 includes a passage unit 4 having an ink passage formed therein and four actuator units 21 that are fixed to a surface of the passage unit 4.

Figure 3:
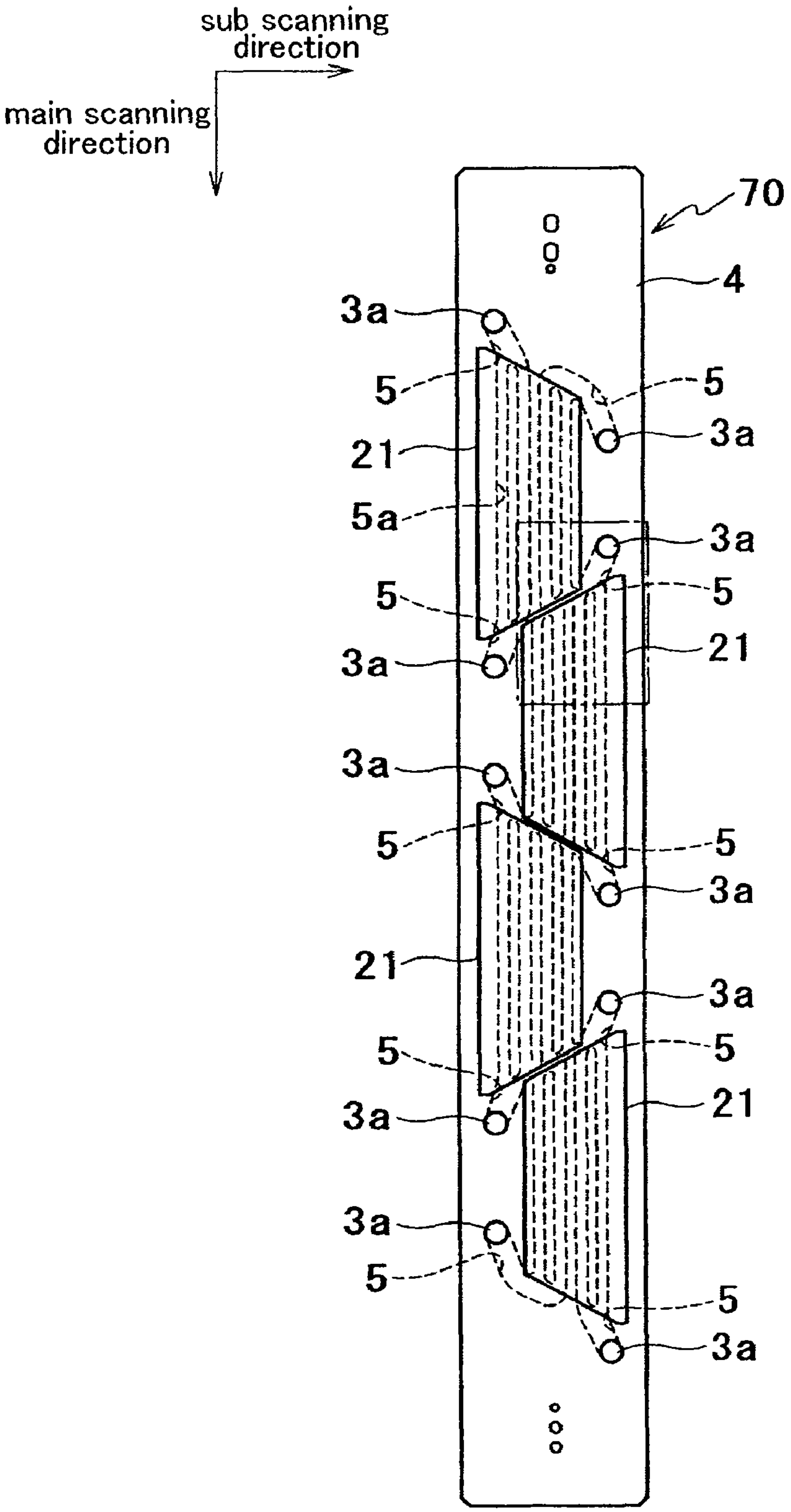
FIG. 3 is a plan view of a head main body included in an ink-jet head.

As shown in FIG. 3, the passage unit 4 has a rectangular shape in plan view extending into a main scanning direction. A surface of the passage unit 4 has ten openings 3*a* formed so that they avoid the actuator units 4. Manifold passages 5 communicating with each of the opening 3*a* are formed in the passage unit 4. Each of the manifold passages 5 is branched into a plurality of sub-manifold passages 5*a* extending in the main scanning direction. Additionally, a number of individual ink passages 7 (see FIG. 7) are formed in the passage unit 4, which communicate with the respective sub-manifold passages 5*a*. The individual ink passages 7 are a passage formed from an outlet of the sub-manifold passages 5*a* to nozzles 8 via apertures 12 functioning as a throttle and pressure chambers 10 and are formed for each of the nozzles 8. The ink stored in the reservoir unit 71 is supplied to the manifold passages 5 through the respective openings 3*a* and then to the sub-manifold passages 5*a*. The ink is again ejected from the nozzles 8 via each of the individual ink passages 7 from the sub-manifold passages 5*a*.

The actuator units 21 have a trapezoidal shape in plan view, respectively, are arranged in a zigzag form so that upper bases and lower bases thereof are directed to the main scanning direction and are fixed to the surface of passage unit 4 with an epoxy-based thermosetting adhesive.

Figure 4:
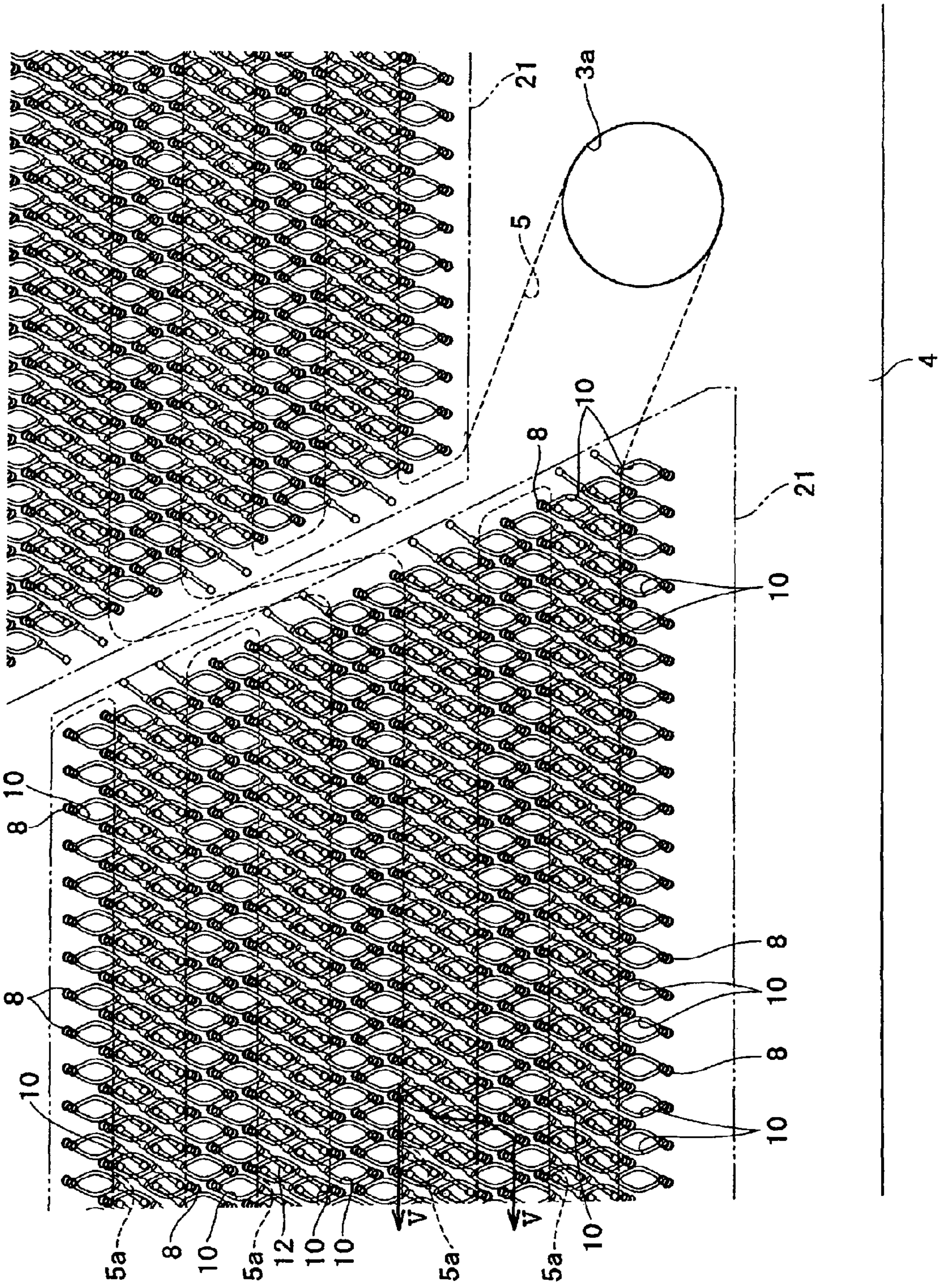
FIG. 4 is an enlarged view of an area surrounded by a dotted dashed line shown in FIG. 3.

A number of nozzles 8 having a minute diameter are arranged in a matrix at areas corresponding to adhering areas of the respective actuator units 21 on a lower surface of the passage unit 4 (see FIG. 4). The pressure chambers 10 corresponding to the respective nozzles 8 are arranged in a matrix at adhering areas of the actuator units 21 on an upper surface of the passage unit 4. Each of the pressure chambers 10 has a substantially rhombus shape in plan view. In FIG. 4, for easy understanding of the drawing, the actuator units 21 are depicted by a dashed dotted line, and the pressure chambers 10, the apertures 12 and the nozzles 8 that are below the actuator units 21 and are to be depicted by a broken line are indicated by a solid line.

As shown in FIG. 4, the pressure chambers 10 are disposed to forms rows at an equal interval along a longitudinal direction of the passage unit 4. The rows of the pressure chambers 10 that are total 16 rows are arranged in parallel with each other in the adhering area of the single actuator unit 21. The numbers of the pressure chambers 10 included in the respective rows of the pressure chambers are gradually decreased toward the shorter upper base from the longer lower base of the trapezoidal actuator unit 21 so that they correspond to the outward appearance of the actuator unit 21. The nozzles 8 are also disposed in the same manner as the pressure chambers 10.

The reservoir unit 71 is described with reference to FIG. 2. In the reservoir unit 71, two ink reservoirs 3 extending along the main scanning direction are formed in parallel. Each of the reservoirs 3 is a hollow area of a substantially rectangular shape and is supplied with ink from an ink tank (not shown) provided to an outside through openings (not shown) communicating with the corresponding ink reservoir 3, so that the reservoirs are always filled with the ink. An opening 3*b* is formed on a lower surface 73 of the reservoir unit 71, which enables the ink reservoirs 3 to communicate with the respective openings 3*a* of the passage unit 4. The ink in the ink reservoirs 3 is supplied into the passage unit 4 through the opening 3*b*.

A surrounding wall of the opening 3*b* forms a protrusion 73*a* that protrudes more downward than the other parts. The reservoir unit 71 is adapted to contact the head main body 70 only at the protrusion 73*a*. In other words, the areas except the protrusion 73 on the lower surface 73 of the reservoir unit 71 are spaced apart from the head main body 70. The actuator units 71 are disposed at the isolated parts.

As shown in FIG. 2, the holder 72 has a holding part 72*a* that holds the reservoir unit 71 and a pair of bases 72*b* that protrude upward from an upper surface of the holding part 72*a*. The reservoir unit 71 is adhered in a groove formed on a lower surface of the holding part 72*a*.

Four FPCs 50 are mounted and the single FPC 50 corresponds to the single actuator unit 21. An area near leading edge of the FPC 50 extends parallel to an upper surface 40*a* of a piezoelectric member 40 (see FIG. 6) of the corresponding actuator unit 21 while confronting the upper surface. An adjacent area continuous to the area near leading edge of the FPC 50 exists at the outside of a space that is formed as the areas except the protrusion 73 on the lower surface 73 of the reservoir unit are spaced apart from the head main body 70. In other words, the adjacent area does not confront the upper surface 40*a* of the piezoelectric member 40 and extends along the holder 72 in a direction away from the upper surface 40*a*. The adjacent areas of the FPCs 50 extend upward while bending to follow sides of the holding part 72*a*, are fixed to the bases 72*b* of the holder 72 through an elastic member 83 such as sponge and extend to follow the bases 72*b* up to top ends of the bases 72*b*.

Driver ICs 80 are attached to outer surfaces of the FPC 50. The driver ICs 80 are electrically connected to wiring formed on the FPCs 50. Heat sinks 82 are provided to outer sides of the driver ICs 80, which dissipate heat generated from the driver ICs 80. The FPCs 50 are fixed with circuit boards 81 above the driver ICs 80 and the heat sinks 82. Between the upper surfaces of the heat sinks 82 and the circuit boards 81 and between the lower surfaces of the heat sinks 82 and the FPCs 50 are respectively adhered with seal members 84, thereby preventing intrusion of dust or ink.

Figure 5:
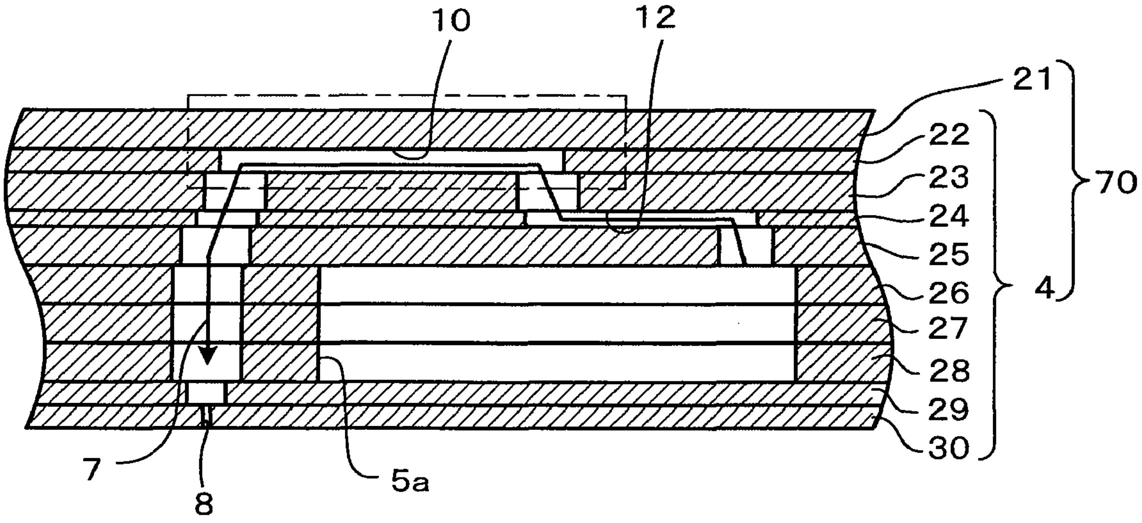
FIG. 5 is a sectional view taken along a line V-V shown in FIG. 4.

In the followings, the structure of the passage unit 4 is more specifically described with reference to FIG. 5.

The passage unit 4 consists of nine laminated plates of a cavity plate 22, a base plate 23, an aperture plate 24, a supply plate 25, three manifold plates 26, 27, 28, a cover plate 29, and a nozzle plate 30. Each of the plates 22-30 has a quadrilateral shape as shown in FIG. 3.

The cavity plate 22 is a metal plate that has a number of substantially rhombus through-holes corresponding to the pressure chambers 10. The base plate 23 is a metal plate that has a number of through-holes for communicating the respective pressure chambers 10 and the apertures 12 with each other and a number of through-holes for communicating the respective pressure chambers 10 and the nozzles 8 with each other. The aperture plate 24 is a metal plate that has a number of through-holes corresponding to the apertures 12 and a number of through-holes for communicating the respective pressure chambers 10 and the nozzles 8 with each other. The supply plate 25 is a metal plate that has a number of through-holes for communicating the respective apertures 12 and the sub-manifold passages 5*a* with each other and a number of through-holes for communicating the respective pressure chambers 10 and the nozzles 8 with each other. Each of the three manifold plates 26, 27 and 28 is a metal plate that has the sub-manifold passages 5*a* and a number of through-holes for communicating the respective pressure chambers 10 and the nozzles 8 with each other. The cover plate 29 is a metal plate that has a number of through-holes for communicating the respective pressure chambers 10 and the nozzles 8 with each other. The nozzle plate 30 is a metal plate that has a number of nozzles 8.

The nine plates 2 to 30 are laminated, being lined up with each other to thereby form the individual ink passages 7. The individual ink passages 7 are a passage that is directed upward from an outlet of the sub-manifold passages 5*a*, extends horizontally in the apertures 12, is again directed upward therefrom, extends horizontally again in the pressure chambers 10, is obliquely directed downward therefrom in a direction away from the apertures 12 and is then directed vertically to the nozzles 8.

In the followings, the structure of the actuator unit 21 is described with reference to FIGS. 6, 7 and 8.

Figure 6:
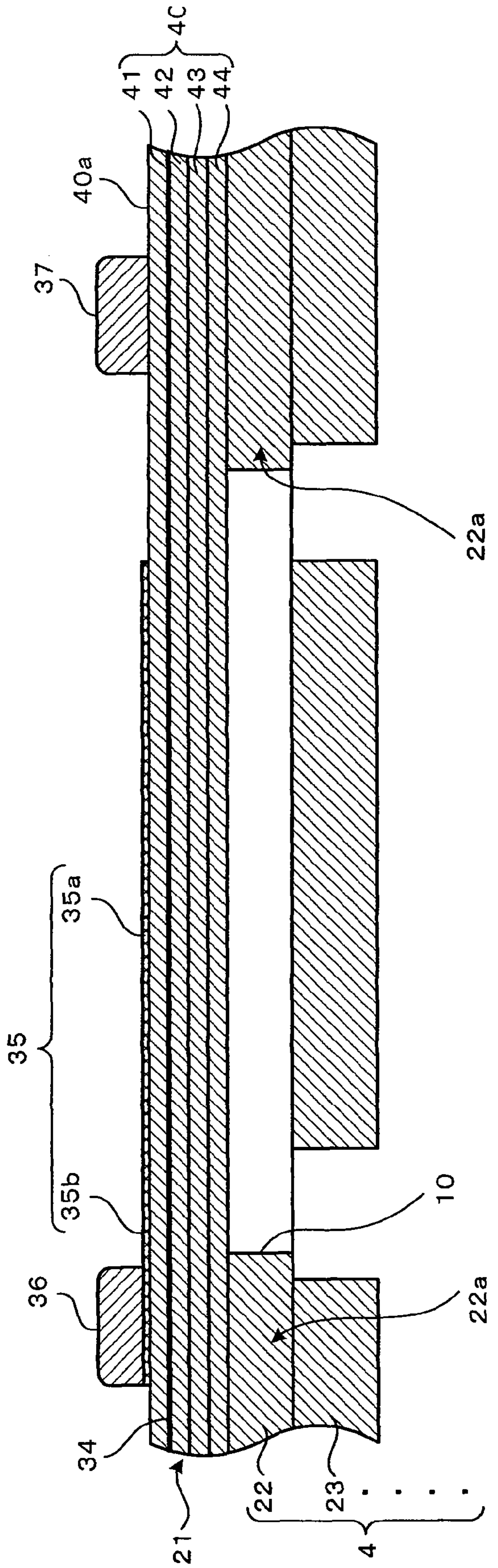
FIG. 6 is an enlarged view of an area surrounded by a dotted dashed line shown in FIG. 53.

As shown in FIG. 6, the actuator units 21 have a piezoelectric member 40 consisting of four piezoelectric sheets 41, 42, 43, 44 that are piled up on one another. Each of the piezoelectric sheets 41 to 44 is composed of ferroelectric Piezoelectric Zicronate Titanate (PZT) based ceramics. Each of the piezoelectric sheets 41 to 44 has a thickness of approximately 15 micrometers. Each of the piezoelectric sheets 41 to 44 has a same trapezoidal shape in plan view as the actuator units 21 shown in FIG. 3.

Figure 7:
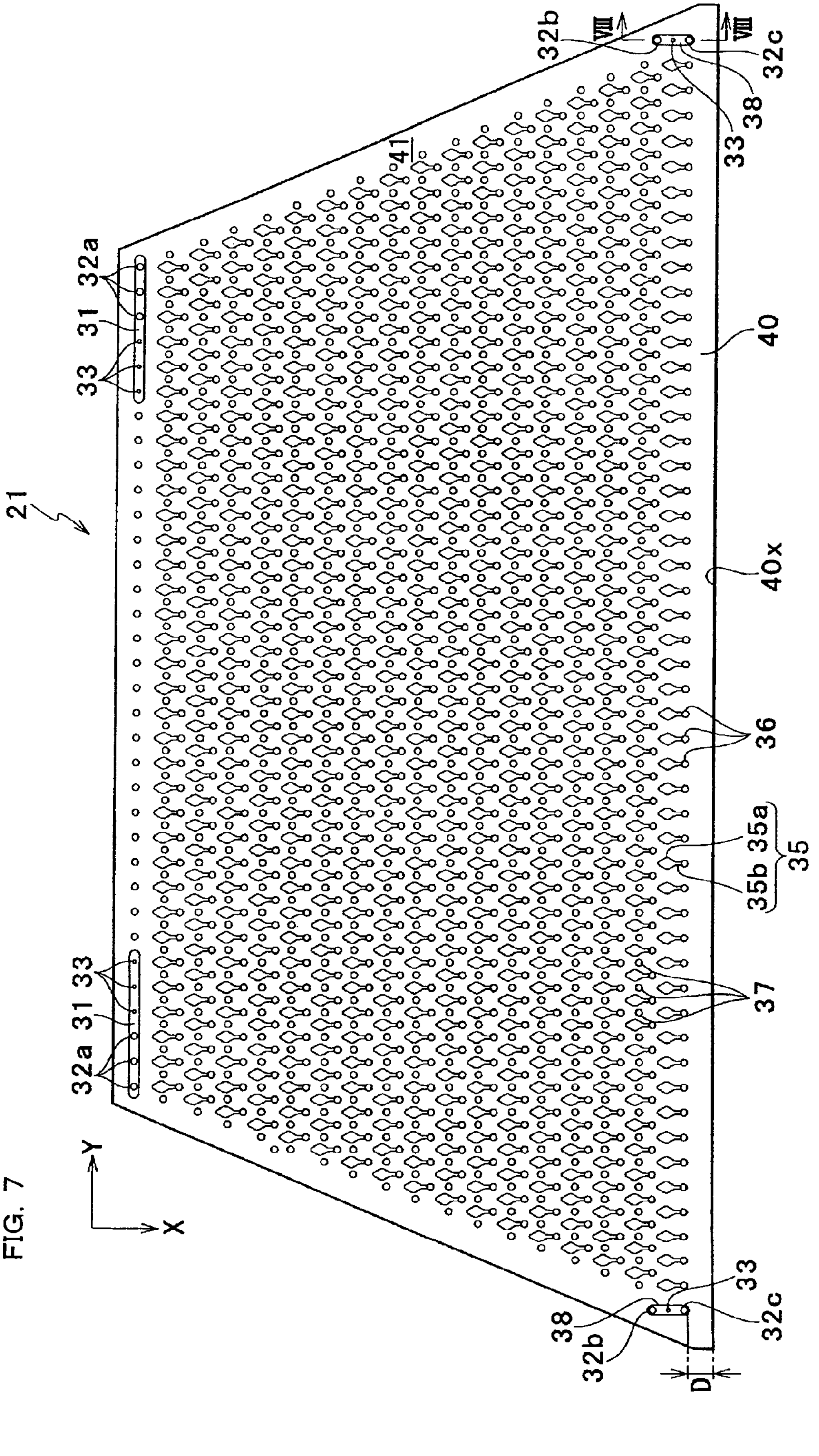
FIG. 7 is a plan view of an actuator unit.

As shown in FIG. 7, on the uppermost piezoelectric sheet 41, a number of individual electrodes 35 are formed, in a matrix, at positions corresponding to each of the pressure chambers 10. Each of the individual electrodes 35 has a thickness of approximately 1 micrometer and comprises a main electrode part 35*a* that is a substantially same shape as the pressure chamber 10 and slightly smaller than the pressure chamber 10 and an auxiliary electrode part 35*b* that is connected to the main electrode part 35*a* and extends from an acute angled part of the main electrode part 35*a*. As shown in FIG. 6, the main electrode parts 35*a* are disposed at positions confronting the pressure chambers 10 and the auxiliary electrode parts 35*b* extend up to positions that do not confront the pressure chambers 10, i.e., positions corresponding to wall 22*a* that defines the pressure chambers 10 of the cavity plate 22. Conductive lands 36 of a substantially cylindrical shape, which are surface terminals, are formed on surfaces of leading ends of the auxiliary electrode parts 35*a*. The lands 36 are composed of iron including glass frit, for example, and are electrically connected to the individual electrodes 35.

As shown in FIG. 7, a common electrode 31 is respectively formed near two obtuse angled parts of the uppermost piezoelectric sheet 41 and a common electrode 38 is respectively formed near two acute angled parts thereof. The common electrodes 31, 38 are formed at positions that are at the outside of the disposal area of the individual electrodes 35 and do not confront the pressure chambers 10. The common electrodes 31, which are formed near the upper base of the piezoelectric sheet 41, have an elongated shape along the upper base of the piezoelectric sheet 41. An upper surface of each of the common electrodes 31 is provided with three lands 32*a* that are spaced at an equal interval. The common electrodes 38, which are formed near the lower base of the piezoelectric sheet 41, have an elongated shape along a direction perpendicular to the lower base of the piezoelectric sheet 41. An upper surface of each of the common electrodes 38 is provided with two lands 32*b*, 32*c*. Each of the common electrodes 31, 38 has a thickness of approximately 1 micrometer same as the individual electrodes 35. Each of the lands 32*a* to 32*c* has substantially same shape and height as the lands 36 adhered to the individual electrodes and is made of same material. The lands 32*a* to 32*c* are disposed at the positions corresponding to the wall parts 22*a* of the cavity plate 22, likewise the lands 36.

The lands 36 adhered to the individual electrodes 35 form a number of land rows along a Y direction, that is the main scanning direction. The land rows adjacent to each other are spaced at a same interval. The lands of the land rows, which are adjacent to each other, are also spaced at a same interval. The lands 32*c* adhered to the common electrodes 38 are disposed at the same positions as the lands 36 of the land rows that are closest to the lower base, with respect to a X direction that is the sub scanning direction. Accordingly, a distance D between the lands 32*c* and an end 40*x* of the X direction of the piezoelectric sheet 40 is same as a distance between the lands 36, which are disposed closest to the end 40*x*, and the end 40*x*. In addition, the two lands 32*c* are disposed at positions that are spaced apart from the lands 36 present at both ends among the land rows closest to the lower base, in the Y direction and a reverse direction thereof by a same distance as the distance between neighboring lands 36 included in the land rows. Like this, by arranging the lands 36, 32*c* regularly, the structure is simplified and the ink-jet head 1 can be easily manufactured.

In addition, the adhering parts between the FPCs 50 and the actuator units 21 are regularly arranged, so that it is possible to remove the non-uniformity of the adhesive strength between them and to increase the adhesive strength between them on the whole.

Figure 8:
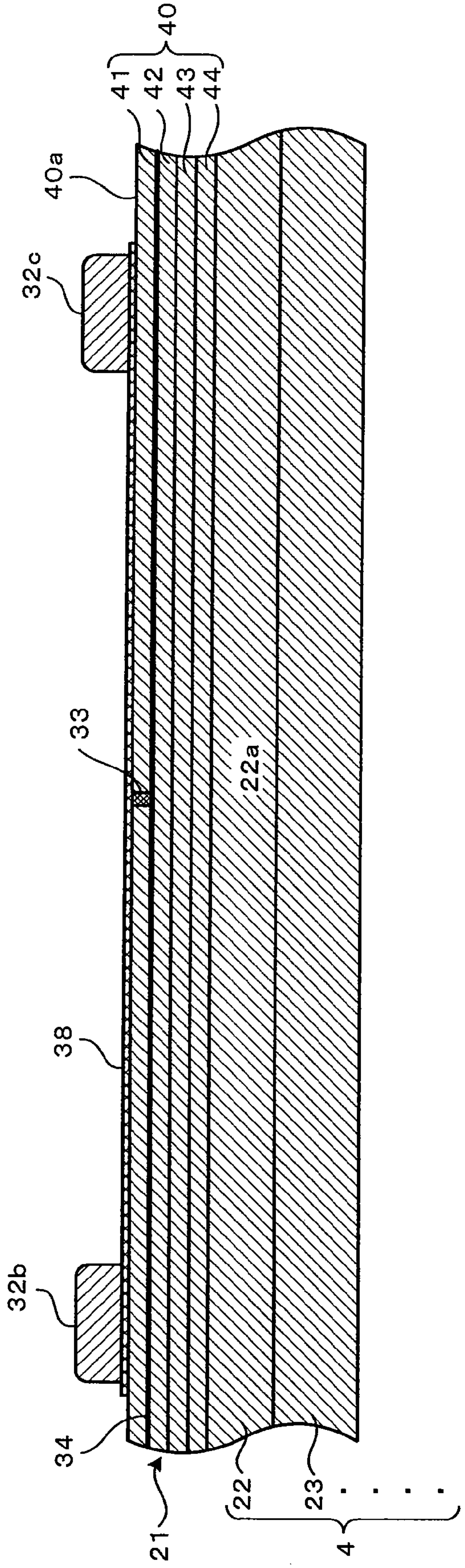
FIG. 8 is a sectional view taken along a line VIII-VIII shown in FIG. 7.

As shown in FIGS. 6 and 8, heights of the lands 36 from the upper surface 40*a* of the piezoelectric member 40 are larger than heights of the individual electrodes 35 from the upper surface 40*a*. In addition, the heights of the lands 36 from the upper surface 40*a* are same as the heights of the lands 32*a* to 32*c* from the upper surface 40*a*. Like this, by making the heights of the lands 36, 32*a* to 32*c* same, it is possible to easily manufacture the lands 36, 32*a* to 32*c* at the same time, to remove the non-uniformity of the adhesive strength between the FPCs 50 and the actuator units 21 and to increase the adhesive strength between them on the whole. Furthermore, since the heights of the lands 36, 32*a* to 32*c* are also same as dummy lands 37, pressure, which is applied when adhering the FPCs 50 to the actuator units 21, are equally transmitted to the lands 36, 32*a* to 32*c* and each of the dummy lands. Accordingly, since the force is equally applied to the adhering parts of all lands 36, 32*a* to 32*c* included in the actuator units 21 and connection terminals 54, 56, it is possible to prevent a connection failure that damages the conductivity.

In addition, since the shapes of the lands 36, 32*a* to 32*c* are substantially same each other, it is possible to easily manufacture the lands 36, 32*a* to 32*c* at the same time. Furthermore, it is possible to remove the non-uniformity of the adhesive strength between the FPCs 50 and the actuator units 21 and to thus increase the adhesive strength between them on the whole.

As shown in FIG. 8, an inner electrode 34 having a thickness of approximately two micrometers is formed between the piezoelectric sheet 41 of the uppermost layer and the piezoelectric sheet 42 underneath the uppermost layer throughout the entire surface. The inner electrode 34 is electrically to the common electrodes 31, 38 through conductive material filled in through-holes 33.

Dummy lands 37 are respectively formed between the two individual electrodes 35 adjacent to each other in the Y direction on the piezoelectric sheet 41 of the uppermost layer. As shown in FIG. 6, the dummy lands 37 are disposed at the positions corresponding to the wall 22*a* of the cavity plate 22, likewise the lands 36. In addition, the dummy lands 37 have substantially same shape and height as the lands 36 and are made of same material. The dummy lands 37 are provided to disperse the pressure applied when fixing the actuator units 21 to the passage unit 4, thereby adhering the units 21, 4 each other, appropriately. The dummy lands 37 are not electrically connected to the wiring on the FPCs 50, contrary to the other lands 36, 32*a* to 32*c*. By providing the dummy lands 37, it is possible to prevent the FPCs 50, which are disposed to cover the surfaces of the piezoelectric members 40, from being bent in a direction close to the surfaces of the piezoelectric members 40 after fixing the FPCs 50 to the actuator units 21. Accordingly, it is possible to prevent the operation of the piezoelectric sheets 41 from being obstructed due to the contact of the FPCs 50 to the main electrode parts 35*a* of the individual electrodes 35.

Figure 9A:
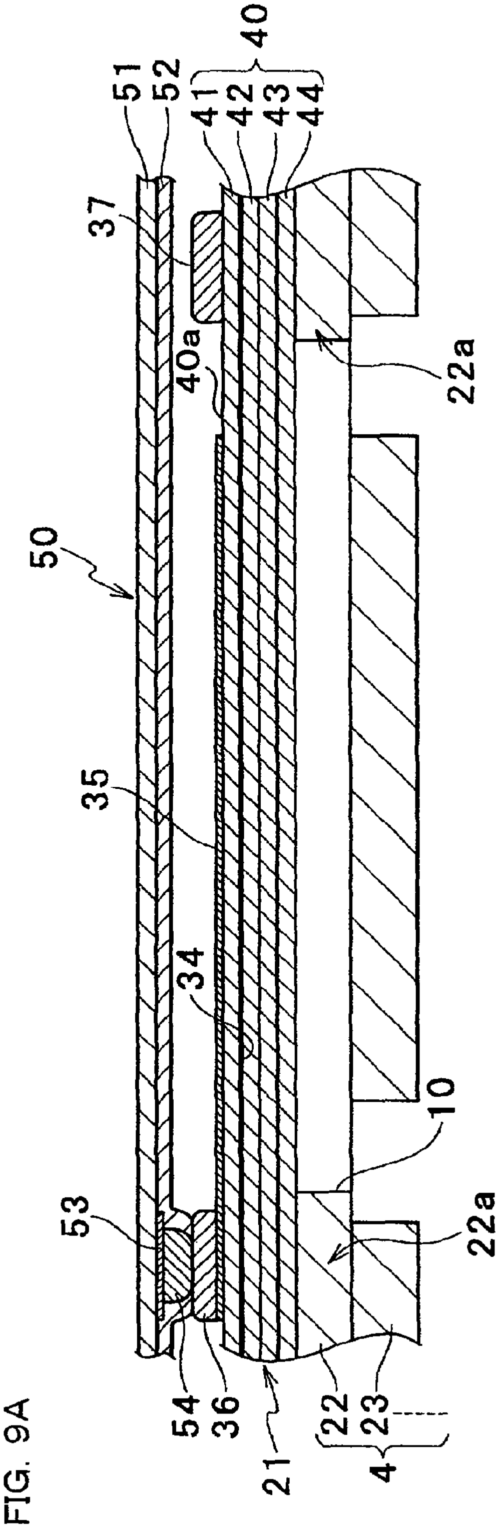
FIG. 9A is a sectional view illustrating connections between lands adhered to individual electrodes of an actuator unit and connection terminals for individual electrodes of a flexible print cable.
Figure 9B:
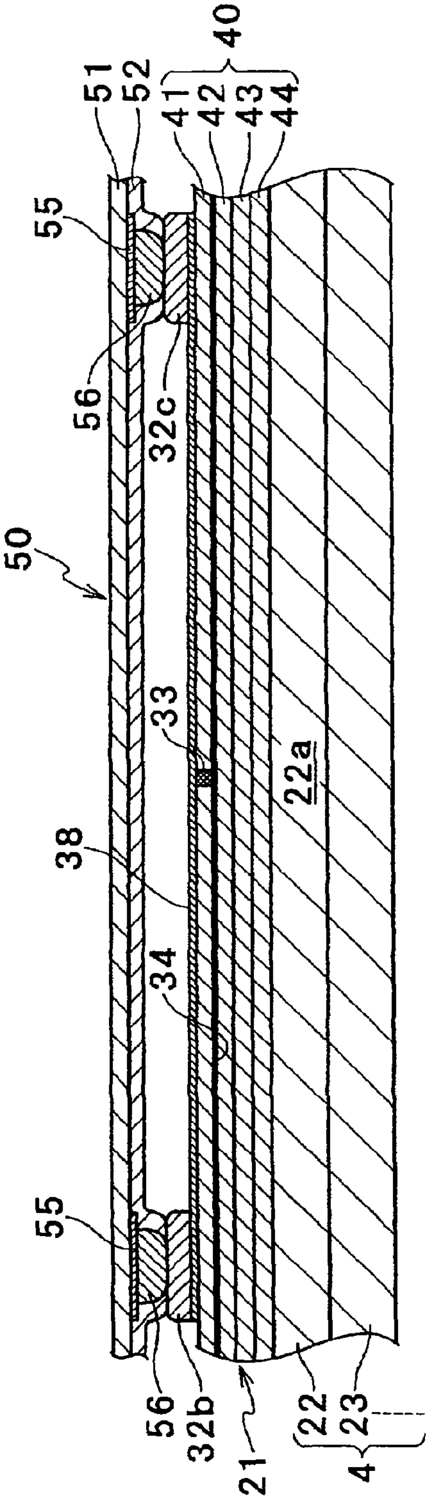
FIG. 9B is a sectional view illustrating connections between lands adhered to common electrodes of an actuator unit and connection terminals for common electrodes of a flexible print cable.

In the followings, the structure of the FPC 50 is described with reference to FIGS. 9A and 9B.

The FPC 50 includes a base film 51 having a thickness of approximately 25 micrometers and a cover film 52 having a thickness of approximately 20 micrometers and covering a substantially overall lower surface of the base film 51. Furthermore, the FPC 50 includes conductive pads 53, 55, each of which is formed between the base film 51 and the cover film 55, made of copper foil and has a thickness of approximately 9 micrometers, and connection terminals 54, 56 formed on each of the conductive pads 53, 55, respectively. The conductive pads 53, 55 are formed on the wiring that is formed between the base film 51 and the cover film 55 in a predetermined pattern and are electrically connected to the driver ICs 80 through the wiring.

The base film 51 and the cover film 52 are sheet members having an insulating property. The base film 51 is comprised of polyimide resin and the cover film 52 is comprised of thermosetting resin.

The conductive pads 53 are formed at positions corresponding to the lands 36 adhered to the individual electrodes 35. The conductive pads 55 are formed at positions corresponding to the lands 32*a* to 32*c* connected to the common electrodes 31, 38. The connection terminals 54, 56 formed on the conductive pads 53, 55 are comprised of conductive material such as nickel and the like. The connection terminals 54, 56 are covered at sides thereof with the cover film 52 and are electrically connected to the corresponding lands 36, 32*a* to 32*c*.

Thereby, the inner electrode 34 (see FIG. 8) is connected to the wiring on the driver IC 80 through the common electrodes 31, 38, the lands 32*a* to 32*c*, the connection terminals 56 and the conductive pads 55. Thereby, electric potential of the inner electrode 34 is maintained at a same potential (ground potential in this embodiment) in areas corresponding to any pressure chambers 10. In addition, each of the individual electrodes 35 is electrically connected to the wiring on the driver ICs 80 through the lands 36, the connection terminals 54 and the conductive pads 53. Thereby, it is possible to individually control the potentials of the individual electrodes 35. When a driving signal outputted from the driver ICs 80 is supplied to the individual electrodes 35 through the FPCs 50, the areas of the piezoelectric sheet 42, which are disposed under the individual electrodes 35 to which the driving signal is supplied, are deformed to swell toward the pressure chambers 10. Due to the change in the volumes of the pressure chambers 10, the ink pressure in the pressure chambers 10 is increased, so that the ink is ejected from the nozzles 8.

Figure 10A:
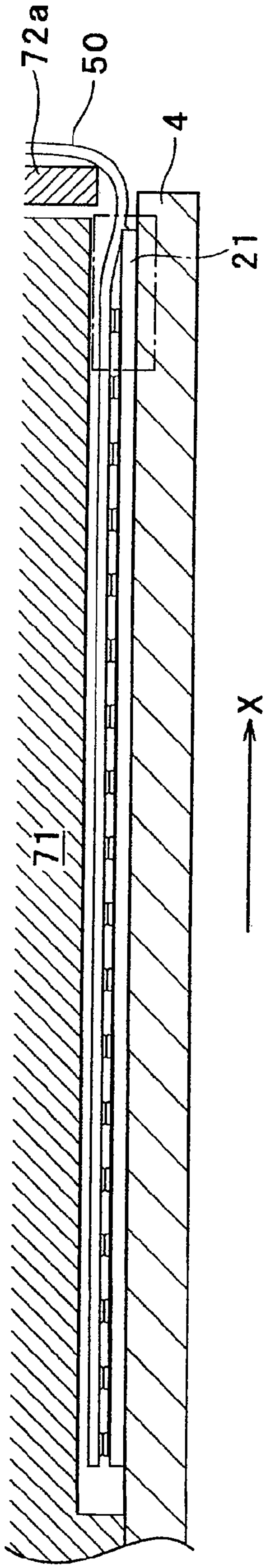
FIG. 10A is a partial view illustrating a state that a flexible print cable fixed to an actuator unit is drawn-out into an outside from a space formed between a lower surface of a reservoir unit and a head main body.
Figure 10B:
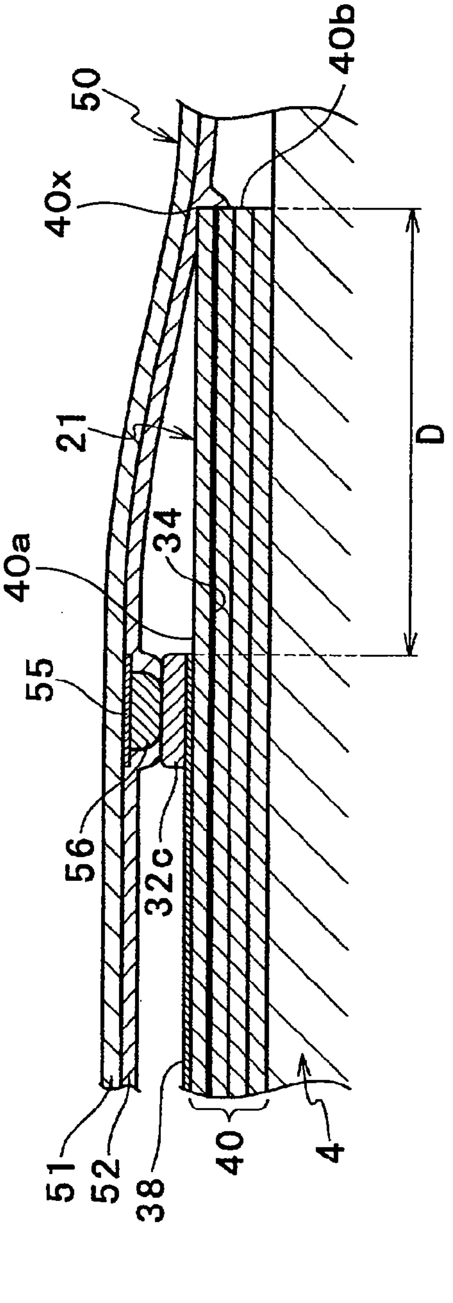
FIG. 10B is an enlarged view of an area surrounded by a dashed dotted line shown in FIG. 10A.

As shown in FIGS. 10A and 10B, the area near leading edge of the FPC 50 confront the upper surface 40*a* of the piezoelectric sheet 40. A leading side of the FPC 50 is present at the same position as the upper base of the actuator unit 21. The area near leading edge of the FPC 50 extends parallel to the upper surface 40*a* of the piezoelectric member 40 in a direction (X direction, i.e., draw-out direction) toward the lower base from the upper base on the upper surface 40*a* of the piezoelectric member 40. An area continuous to the area near leading edge of the FPC 50 is at a region beyond the lower base with respect to the X direction. As described above, the adjacent area of the FPC 50 does not confront the upper surface 40*a* of the piezoelectric member 40 and extends along the holder 72 in a direction away from the upper surface 40*a*.

As shown in FIGS. 7 and 10B, there is a area near the end 40*x* of the upper surface 40*a* of the piezoelectric member 40, in which no lands 36, 32*a* to 32*c* are disposed, i.e., a area corresponding to the distance D. A length of the area in the X direction is longer, as compared to a case where the lands 32*c* are formed in the area. Therefore, a part of the adjacent area close to the vicinity of the leading end of the FPC confronting the upper surface 40*a* of the piezoelectric member 40, is bent to the area by self-weight, thereby contacting the piezoelectric member 40. The part is adhered, at the end 40*x*, to the upper surface 40*a* and a side 40*b* of the piezoelectric member 40 through the cover film 21 made of thermosetting resin.

In the followings, it is described a method of manufacturing the ink-jet head 1.

First, the passage unit 4 and the actuator units 21 are individually prepared, respectively. The passage unit 4 is prepared by aligning the plates 22 to 30 having predetermined through-holes formed therein so that the individual ink passages 7 are formed and then adhering the plates with an adhesive.

When manufacturing the actuator units 21, it is first prepared green sheets of piezoelectric ceramics having a trapezoidal shape, which will be the four piezoelectric sheets 41 to 44. Then, the green sheet, which will be the piezoelectric sheet 41, is formed with the through-holes 33 in which the conductive material is then filled. Conductive paste, which will be the inner electrode 34, is then printed on the green sheet, which will be the piezoelectric sheet 42, on which the green sheet having the through-holes 33 formed therein is piled up. Then, the other two green sheets are further stacked under the green sheet. Then, the four green sheets are fired at a predetermined temperature. After that, conductive paste, which will be the individual electrodes 35 and the common electrodes 31, 38, is pattern-printed on the piezoelectric sheet 41 formed by the firing and then the firing is performed. Furthermore, the iron including glass frit which will be the lands 36, 32*a* to 32*c* and the dummy lands 37 are printed and the firing is then performed. Thereby, the actuator unit 21 is prepared. When manufacturing the actuator units 21, the lands 32*c* adhered to the common electrodes 38 are made to be disposed at the same positions as the lands 36 of the land rows that are closest to the lower base, with respect to the X direction.

Then, the actuator units 21 prepared as described above are adhered to the passage unit 4 with the thermosetting adhesive. At this time, the actuator units 21 are position-aligned so that the piezoelectric member 40 extends across the pressure chambers 10, the inner electrode 34 extends across the pressure chambers 10 and the individual electrodes 35 are disposed at the positions corresponding to the respective pressure chambers 10, and are fixed to the passage unit 4 by press and heating.

Then, the FPCs 50 are fixed to the actuator units 21 so that the area near leading edge of the FPC 50 confronts the upper surface 40*a* of the piezoelectric member 40. Before performing this process, the surfaces of the connection terminals 54, 56 formed to the FPC 50 are not exposed but covered by the cover film 52. In this process, the FPCs 50 are position-aligned so that the connection terminals 54 confront the lands 36 adhered to the individual electrodes 35 and the connection terminals 56 confront the common electrodes 31, 38. Then, while a ceramic heater (not shown) is disposed on the base film 51 of the FPC 50 to heat the cover film 52 to reach a setting temperature or more of the thermosetting resin constituting the cover film, the FPC 50 is pressed to the actuator unit 21. Owing to the press, the cover film 52 covering the surfaces of the connection terminals 54, 56 is pushed away, so that the connection terminals 54, 56 contact the corresponding lands 36, 32*a* to 32*c*. When the heating is conducted under such state, the cover film 52 adjacent to the connection terminals 54, 56 becomes open to the lands 36, 32*a* to 32*c* from the connection terminals 54, 56. Then, the cover film 52 is set, so that the electrical and mechanical connections between the connection terminals and the lands are realized.

In addition, the FPC 50 is bent downward, due to the self-weight thereof, toward the area corresponding to the surface distance D adjacent to the end 40*x* of the piezoelectric member 40, thereby contacting the piezoelectric member 40. Under such state, the cover film 52 is set, so that the FPC 50 is adhered to the upper surface 40*a* and the side 40*b* of the piezoelectric member 40 at the end 40*x* through the cover film 52.

Then, after performing the processes of attaching the reservoir unit 71 and the holder 72 and the like, the FPC 50 is bent so that the adjacent area of the FPC 50 extends in the direction away from the upper surface 40*a* of the piezoelectric member 40.

Although detailed descriptions are omitted herein, the passage unit 4, the actuator units 21 and the FPCs 50 are prepared to have the structures as described above.

As described above, according to this embodiment, the lands 32*c*, which are formed on the upper surface 40*a* of the piezoelectric member 40 and are also electrically connected to the inner electrode 34, are not disposed at a more downstream position in the X direction than the lands 36 adhered to the individual electrodes 35 which are present at the most downstream position with respect to the X direction. The lands 32*c* are disposed at the same positions as the lands 36 with respect to the X direction. Accordingly, a area, which is relatively long in the X direction, occurs near the end 40*x* of the upper surface 40*a* of the piezoelectric member 40, in which the area no lands 36, 32*a* to 32*c* are disposed. Accordingly, the FPC 50 is bent toward to the corresponding area, thereby contacting the piezoelectric member 40. The FPC 50 is adhered to the piezoelectric member 40 at the contact parts, through the cover film 52 comprised of thermosetting resin. By the adhesion through the cover film 52, the adhesion reinforcement between the FPC 50 and the piezoelectric member 40 is realized. Therefore, when the FPC 50 is bent so that the adjacent area of the FPC 50 extends in the direction away from the upper surface 40*a* of the piezoelectric member 40, the electrical connections between the FPCs 50 and the actuator units 21, i.e., the adhesion parts between the connection terminals 54 and the lands 36 and between the connection terminals 56 and the lands 32*a* to 32*c* are not directly applied with the force, so that it is possible to prevent the electrical connections from being destroyed. Furthermore, since the electrical connection between the FPC 50 and the actuator unit 21 is sealed due to the mechanical connection of the FPC 50 and the end 40*x* of the piezoelectric member 40, it is difficult for the ink having intruded from the outside to reach the electrical connection, so that it is possible to prevent the electrical failure such as short due to the ink.

According to the method of manufacturing the ink-jet head 1 of this embodiment, since the cover film 52 comprised of thermosetting resin is set by the heating, it is possible to realize the electrical and mechanical connections between the connection terminals 54, 56 and the lands 36, 32*a* to 32*c* and the mechanical connection between the FPC 50 and the end 40*x* of the piezoelectric member 40 in a single process. Accordingly, it is possible to suppress the number of processes, as compared to a case where the connection terminals 54, 56 are electrically connected with the lands 36, 32*a* to 32*c* with soldering and then the FPC 50 is adhered to the end 40*x* of the piezoelectric member 40. In other words, according to the manufacturing method of this embodiment, it is possible to obtain the ink-jet head 1 achieving the above effects while suppressing the increase in the number of the manufacturing processes.

Furthermore, as shown in FIG. 7, the lands 36 disposed closest to the end 40*x* are located at the more downstream position than the corresponding individual electrodes 35 disposed closest to the end 40*x*, with respect to the X direction. Thereby, it is more difficult for the FPC 50 to contact the individual electrodes 35 than a case where the lands 36 disposed closest to the end 40*x* are located at the more upstream position than the corresponding individual electrodes 35 with respect to the X direction. Since the FPC 50 is not well contacted to the individual electrodes 35 except the individual electrodes 35 disposed closest to the end 40*x*, there is little a case where the FPC 50 contacts any individual electrodes 35. Therefore, all the displacements of the parts confronting the pressure chambers of the piezoelectric member 40 become same, so that a print quality is improved.

In addition, according to this embodiment, the lands 36, 32*a* to 32*c* are disposed at the positions corresponding to the wall 22*a*. When the lands 36, 32*a* to 32*c* are disposed at positions corresponding to the pressure chambers 10, rather than the wall 22*a*, the corresponding parts of the pressure chambers 10 are apt to be damaged by the pressure applied in fixing the actuator units 21 to the passage unit 4 or fixing the FPCs 50 to the actuator units 21. Contrary to this case, this embodiment can prevent the damage.

The individual electrodes 35 and the lands 36 are disposed in a matrix on the surface of the piezoelectric member 40, so that the high resolution can be realized.

According to this embodiment, as shown in FIG. 10B, the FPC 50 is adhered to both the upper surface 40*a* and the side 40*b* of the piezoelectric member 40 through the cover film 32 comprised of thermosetting resin. However, even when the FPC 50 is adhered to only to the upper surface 40*a* or side 40*b* of the piezoelectric member 40, it is possible to obtain the adhesion strength, as the case where the outside force is not directly applied to the electrical connection between the FPC 50 and the actuator unit 21. However, the FPC 50 is adhered to both the upper surface 40*a* and the side 40*b*, so that the adhesion reinforcement strength through the cover film 52 is further increased. Accordingly, even when the force destroying the corresponding adhesion parts is applied, it is possible to suppress the destruction of the adhesion parts, more effectively. As a result, it is possible to prevent the force from being applied to the connections between the lands 36, 32*a* to 32*c* and the connection terminals 54, 56, more securely.

In the followings, it will be described several modifications to the above embodiment. Among the lands 32*a* to 32*c* adhered to the common electrodes, the distance D between the lands 32*c* disposed at the most downstream position with regard to the X direction and the end 40*x* of the piezoelectric member 40 may be larger than a distance between the lands 36 disposed closest to the end 40*x* and the end 40*x*.

The present invention is not limited to the case where the common electrodes are formed near the four corners on the upper surface of the piezoelectric member 40. As long as the lands adhered to the common electrodes are not formed at more downstream positions than the lands 36 adhered to the individual electrodes 35 with respect to the X direction, the common electrodes may be formed at arbitrary positions.

The shape of the piezoelectric member 40 is not limited to the trapezoidal shape and may be formed into any other shapes.

As long as the piezoelectric member 40 extends across the pressure chambers 40 and has the inner electrode 34 therein and the individual electrodes 35 and the lands 36 thereof and the common electrodes and the lands thereof formed on its surface, it may be structured in various ways.

The positions of the lands 36 and the lands 32*a* to 32*c* on the upper surface 40*a* of the piezoelectric member 40 may be appropriately changed. The present invention is not limited to the case where the heights of the lands 36 and the lands 32*a* to 32*c* from the upper surface 40*a* of the piezoelectric member 40 are same. In addition, the shapes of the lands 36, 32*a* to 32*c* may be arbitrarily changed.

The lands 36 adhered to the individual electrodes 35 may be formed at the positions corresponding to the pressure chambers, rather than the positions corresponding to the wall 22*a* of the cavity plate 22.

The present invention is not limited to the case where the individual electrodes 35 are disposed in a matrix. For example, the individual electrodes may be disposed in a line.

According to the above embodiment, the FPC 50 is adhered to both the upper surface 40*a* and the side 40*b* of the piezoelectric member 40. However, the FPC may be adhered to only one of the upper surface 40*a* and the side 40*b*. In addition, the FPC 50 may be adhered to the piezoelectric member 40 at a place except the end 40*x* of the piezoelectric member 40, specifically at any place between the end 40*x* and the lands 32*b*, 32*c*, 36 with respect to the X direction.

According to the above embodiment, the cover film 52, which covers the substantially entire lower surface of the FPC 50, is used to adhere the FPC 50 to the vicinity of the end 40*x* of the piezoelectric member 40. However, only a part of the FPC 50 confronting the vicinity of the end 40*x* of the piezoelectric member 40 may be applied with the thermosetting adhesive in advance and then the heating may be conducted, thereby realizing the adhesion between the connection terminals 54, 56 of the FPC 50 and the lands 36, 32*a* to 32*c* and the adhesion of the FPC 50 to the vicinity of the end 40*x* of the piezoelectric member 40 by the setting of the thermosetting adhesive at the same time.

When conducting the adhesions between the connection terminals 54 of the FPC 50 and the lands 36 and between the connection terminals 56 of the FPC 50 and the lands 32*a* to 32*c*, any metal adhesives such as soldering may be used, rather than the thermosetting adhesive.

According to the above embodiment, the self-weight of the FPC 50 is used when adhering the FPC 50 to the end 40*x* of the piezoelectric member 40. However, the present invention is not limited thereto. For example, the pressure may be positively applied to the FPC 50, thereby causing the FPC 50 to contact the end 40*x* of the piezoelectric member 40, and the cover film 52 or the thermosetting adhesive may be then set. By doing so, it is possible to adhere the FPC 50 to the end 40*x* of the piezoelectric member 40, more securely.

In addition to the adhesion of the FPC 50 to the end 40*x* of the piezoelectric member 40, the FPC 50 may be adhered to the upper surface of the passage unit 4 at the downstream position lower than the end 40*x* of the piezoelectric member 40 with respect to the X direction, through the cover film 52 or thermosetting adhesive. Thereby, it is more difficult to apply the outside force to the electrical connections between the FPCs 50 and the actuator units 21, so that it is possible to prevent the electrical connections from being destroyed, more securely.

While this invention has been described in conjunction with the specific embodiments outlined above, it is evident that many alternatives, modifications and variations will be apparent to those skilled in the art. Accordingly, the preferred embodiments of the present invention as set forth above are intended to be illustrative, not limiting. Various changes may be made without departing from the spirit and scope of the present invention as defined in the following claims.

What is claimed is:

1. An ink-jet head comprising:

a passage unit having a plurality of pressure chambers communicating with nozzles;

an actuator unit that changes the volumes of the plurality of the pressure chambers; and a flexible print cable that supplies a driving signal to the actuator unit, wherein the actuator unit includes, a piezoelectric member fixed to the passage unit so that it extends across the plurality of the pressure chambers;

an inner electrode formed so that it extends across the plurality of the pressure chambers in the piezoelectric member, a plurality of individual electrodes formed at positions corresponding to the plurality of the pressure chambers on a surface facing a direction opposite to a facing direction of a fixing face of the piezoelectric member to the passage unit;

one or more first surface terminals that are formed on the surface of the piezoelectric member and are also electrically connected to the inner electrode; and a plurality of second surface terminals that are formed on the surface of the piezoelectric member and are also electrically connected to the plurality of the individual electrodes, wherein a partial area of the flexible print cable confronts the surface of the piezoelectric member and an adjacent area continuous to the partial area extends in a direction away from the surface of the piezoelectric member, wherein the flexible print cable has, in the partial area, one or more first connection terminals electrically connected to the one or more first surface terminals and a plurality of second connection terminals electrically connected to the plurality of the second surface terminals, wherein a distance between an end and the first surface terminal disposed closest to the end is equal to or greater than a distance between the end and the second surface terminal disposed closest to the end, the end being present at the most downstream position on the surface of the piezoelectric member with respect to a first direction toward the adjacent area on the partial area along the surface, and wherein the flexible print cable is adhered to the piezoelectric member at a more downstream position than the first and second surface terminals with respect to the first direction, via a thermosetting adhesive.

2. The ink-jet head according to claim 1, wherein two or more of the second surface terminals are disposed at an equal interval while forming a row along a second direction perpendicular to the first direction, and wherein the first surface terminal disposed closest to the end is present at the same position as the second surface terminals included in the row, with respect to the first direction, and is disposed at a position that is spaced apart from the second surface terminal present at the outermost, with respect to the second direction, among the second surface terminals include in the row, in the second direction by a substantially same distance as the distance between the second surface terminals included in the row.

3. The ink-jet head according to claim 1, wherein the heights of the second surface terminals from the surface is greater than the heights of the corresponding individual electrodes from the surface and are the same as the heights of the one or more first surface terminals from the surface.

4. The ink-jet head according to claim 1, wherein the shapes of the one or more first surface terminals and the plurality of the second surface terminals are substantially the same as each other.

5. The ink-jet head according to claim 1, wherein the second surface terminal disposed closest to the end is present at more downstream position than the corresponding individual electrode, with respect to the first direction.

6. The ink-jet head according to claim 1, wherein the passage unit has wall that defines the plurality of the pressure chambers, wherein the one or more first surface terminals and the plurality of the second surface terminals are disposed at positions corresponding to the wall.

7. The ink-jet head according to claim 1, wherein the plurality of the individual electrodes and the plurality of the second surface terminals are disposed in a matrix on the surface of the piezoelectric member, respectively.

8. The ink-jet head according to claim 1, wherein the flexible print cable is adhered to a side of the piezoelectric member which is continuous to the surface at the end, via the thermosetting adhesive.

9. The ink-jet head according to claim 8, wherein the flexible print cable is adhered to the surface and the side of the piezoelectric member through the thermosetting adhesive.

10. A method of manufacturing an ink-jet head comprising processes of:

preparing a passage unit having a plurality of pressure chambers communicating with nozzles;

preparing an actuator unit that changes the volumes of the plurality of the pressure chambers and includes a piezoelectric member having an inner electrode formed therein;

fixing the actuator unit to the passage unit; and fixing a flexible print cable to the actuator unit, the flexible print cable supplying a driving signal to the actuator unit and having a partial area in which one or more first connection terminals and a plurality of second connection terminals are formed and an adjacent area continuous to the partial area, wherein the process of preparing the actuator unit comprises, an electrode forming process of forming a plurality of individual electrodes on a surface of the piezoelectric member, and a terminal forming process of forming one or more first surface terminals electrically connected to the inner electrode and a plurality of second surface terminals adhered to the plurality of the individual electrodes on the surface of the piezoelectric member, wherein in the process of fixing the actuator unit, a fixing face of the piezoelectric member, which faces a direction opposite to a facing direction of the surface, is fixed to the passage unit so that the plurality of the individual electrodes are disposed at positions corresponding to the pressure chambers while the piezoelectric member and the inner electrode extend across the plurality of the pressure chambers, wherein in the terminal forming process, the one or more first surface terminals are formed so that a distance between an end and the first surface terminal disposed closest to the end is equal to or greater than a distance between the end and the second surface terminal disposed closest to the end, the end being present at the most downstream position on the surface of the piezoelectric member with respect to a first direction toward the adjacent area on the partial area along the surface, and wherein in the process of fixing the flexible print cable, the first connection terminal disposed closest to the adjacent area is electrically connected to the first surface terminal disposed closest to the end and the plurality of the second connection terminals are electrically connected to the plurality of the second surface terminals by heating so that the partial area confronts the surface of the piezoelectric member, and the flexible print cable is adhered to the piezoelectric member at a more downstream position than the first and second surface terminals with respect to the first direction, via a thermosetting adhesive, and further comprising a process of bending the flexible print cable so that the adjacent area of the flexible print cable extends in a direction away from the surface of the piezoelectric member.

11. The method according to claim 10, wherein in the terminal forming process, two or more of the second surface terminals are formed so that they are spaced at an equal interval while forming a row along a second direction perpendicular to the first direction, and the first surface terminal disposed closest to the end is present at the same position as the second surface terminals included in the row, with respect to the first direction, and is disposed at a position that is spaced apart from the second surface terminal located at the outermost, with respect to the second direction, among the second surface terminals include in the row, in the second direction by a substantially same distance as the distance between the second surface terminals included in the row.

12. The method according to claim 10, wherein in the terminal forming process, the plurality of the second surface terminals are formed so that a height of each second surface terminal from the surface is greater than a height of the corresponding individual electrode from the surface, and the one or more first surface terminals are formed so that the heights of the first surface terminals from the surface are the same as the heights of the second surface terminals from the surface.

13. The method according to claim 10, wherein in the terminal forming process, the one or more first surface terminals and the plurality of the second surface terminals are shaped so that the shapes of the one or more first surface terminals and the plurality of the second surface terminals are substantially the same as each other.

14. The method according to claim 10, wherein in the terminal forming process, the second surface terminal disposed closest to the end is formed at more downstream position than the corresponding individual electrode, with respect to the first direction.

15. The method according to claim 10, wherein in the process of preparing the passage unit, wall that defines the plurality of the pressure chambers is formed in the passage unit, and wherein in the terminal forming process, the one or more first surface terminals and the plurality of the second surface terminals are disposed at positions corresponding to the wall.

16. The method according to claim 10, wherein in the electrode forming process, the plurality of the individual electrodes are disposed in a matrix on the surface of the piezoelectric member, and wherein in the terminal forming process, the plurality of the second surface terminals are disposed in a matrix on the surface of the piezoelectric member.

17. The method according to claim 10, wherein in the process of fixing the flexible print cable, the flexible print cable is adhered to a side of the piezoelectric member which is continuous to the surface at the end, via the thermosetting adhesive.

18. The method according to claim 17, wherein in the process of fixing the flexible print cable, the flexible print cable is adhered to the surface and the side of the piezoelectric member via the thermosetting adhesive.

* * * * *